United States Patent
Nishibayashi et al.

(10) Patent No.: US 11,518,680 B2
(45) Date of Patent: Dec. 6, 2022

(54) BODY OBTAINED BY PROCESSING SOLID CARBON-CONTAINING MATERIAL, PRODUCING METHOD THEREOF, AND PRODUCING APPARATUS THEREOF

(71) Applicant: Sumitomo Electric Industries, Ltd., Osaka (JP)

(72) Inventors: Yoshiki Nishibayashi, Osaka (JP); Natsuo Tatsumi, Osaka (JP); Kensei Hamaki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 456 days.

(21) Appl. No.: 16/638,925

(22) PCT Filed: Aug. 13, 2018

(86) PCT No.: PCT/JP2018/030179
§ 371 (c)(1),
(2) Date: Feb. 13, 2020

(87) PCT Pub. No.: WO2019/035438
PCT Pub. Date: Feb. 21, 2019

(65) Prior Publication Data
US 2020/0361778 A1    Nov. 19, 2020

(30) Foreign Application Priority Data
Aug. 15, 2017    (JP) .............................. JP2017-156849

(51) Int. Cl.
*C01B 32/28* (2017.01)
*B24B 37/20* (2012.01)
(Continued)

(52) U.S. Cl.
CPC .............. *C01B 32/28* (2017.08); *B24B 37/20* (2013.01); *C01B 32/336* (2017.08); *C09K 3/14* (2013.01);
(Continued)

(58) Field of Classification Search
CPC ....... C01B 32/28; C01B 32/00; C01B 32/336; B24B 37/20; C09K 3/14; C30B 29/04;
(Continued)

(56) References Cited

U.S. PATENT DOCUMENTS 4,339,304 A   7/1982   Grigoriev et al.
5,135,807 A   8/1992   Ito et al.
(Continued)

FOREIGN PATENT DOCUMENTS

EP    0615004 A1    3/1994
GB    2 061 904 B   3/1983
(Continued)

OTHER PUBLICATIONS

Office Action dated Jan. 3, 2022 that issued in U.S. Appl. No. 16/638,906.
(Continued)

*Primary Examiner* — Kiet T Nguyen
(74) *Attorney, Agent, or Firm* — Faegre Drinker Biddle & Reath LLP (57) ABSTRACT

A method for producing a body obtained by processing a solid carbon-containing material, the method includes: preparing the solid carbon-containing material composed of a material having at least a surface containing solid carbon; forming a gas phase fluid containing at least one of an active gas or an active plasma which are active against the solid carbon; and processing the solid carbon-containing material by injecting the gas phase fluid onto at least a part of the surface of the solid carbon-containing material.

19 Claims, 4 Drawing Sheets

(51) Int. Cl.
*C09K 3/14* (2006.01)
*C30B 29/04* (2006.01)
*C30B 33/12* (2006.01)
*C01B 32/336* (2017.01)

(52) U.S. Cl.
CPC ............. *C30B 29/04* (2013.01); *C30B 33/12* (2013.01); *C01P 2002/82* (2013.01); *C01P 2006/90* (2013.01)

(58) Field of Classification Search
CPC .. C30B 33/12; C01P 2002/82; C01P 2006/90; C04B 41/009; C04B 41/5346; C04B 41/91; C04B 41/0054; C04B 35/52
USPC .......................................................... 51/307
See application file for complete search history.

(56) References Cited

U.S. PATENT DOCUMENTS

| | | | | |
|---|---|---|---|---|
| 5,368,897 | A * | 11/1994 | Kurihara | C30B 25/02 423/446 |
| 2001/0047980 | A1 | 12/2001 | McNallan et al. | |
| 2010/0213175 | A1 | 8/2010 | Peng et al. | |
| 2012/0082614 | A1 | 4/2012 | Lee et al. | |
| 2014/0268804 | A1 | 9/2014 | Yang | |
| 2016/0115624 | A1 | 4/2016 | Pels et al. | |
| 2017/0066110 | A1 | 3/2017 | Bird | |
| 2017/0183794 | A1 | 6/2017 | Godfried et al. | |
| 2017/0320144 | A1 | 11/2017 | Nishibayashi et al. | |
| 2020/0361829 | A1* | 11/2020 | Nishibayashi | C30B 33/12 |
| 2021/0148005 | A1 | 5/2021 | Noguchi et al. | |

FOREIGN PATENT DOCUMENTS

| | | |
|---|---|---|
| JP | S56-500371 A | 3/1981 |
| JP | S62-41800 A | 2/1987 |
| JP | H04-331800 A | 11/1992 |
| JP | H08-57753 A | 3/1996 |
| JP | H11-236292 A | 8/1999 |
| JP | 2001-220251 A | 8/2001 |
| JP | 2006-335591 A | 12/2006 |
| JP | 2010-64909 A | 3/2010 |
| JP | 2016-98129 A | 5/2016 |
| RU | 2620392 C1 | 5/2017 |

OTHER PUBLICATIONS

Office Action dated Sep. 10, 2021 that issued in U.S. Appl. No. 16/638,906.

Office Action dated Apr. 25, 2022 that issued in U.S. Appl. No. 16/638,906.

Nakano, Takayuki et al., "Ultra-precision Machining of PCD by UV-assisted Polishing," Journal of the Japan Society for Abrasive Technology, vol. 53, No. 4, Apr. 2009, pp. 242-247, including partial English translation.

Kitano, Katsuhisa et al., "Low-Frequency Atmospheric Pressure Micro Plasma Jet," Applied Physics, vol. 77, No. 4, Apr. 2008, pp. 383-389, including partial English translation.

Nishibayashi, Yoshiki et al., "Various Field Emitters of Single Crystal Diamond," New Diamond and Frontier Carbon Technology, vol. 13, No. 1, Jan. 2003, pp. 19-30.

Office Action dated Aug. 26, 2022 that issued in U.S. Appl. No. 16/638,906.

* cited by examiner

BODY OBTAINED BY PROCESSING SOLID CARBON-CONTAINING MATERIAL, PRODUCING METHOD THEREOF, AND PRODUCING APPARATUS THEREOF

TECHNICAL FIELD

The present disclosure relates to a body obtained by processing a solid carbon-containing material, a producing method thereof, and a producing apparatus thereof. The present application claims priority based on Japanese Patent Application No. 2017-156849 filed Aug. 15, 2017. All descriptions described in the Japanese patent application are incorporated herein by reference.

BACKGROUND ART

Examples of methods for processing a solid carbon-containing material such as diamond include mechanical processing methods such as cutting, grinding, and/or polishing, and chemical processing methods using excited species such as a plasma, an ion, and/or a radical.

As the mechanical processing method, Journal of the Japan Society for Abrasive Technology, Vol. 53, No. 4, April 2009, pp. 242-247 (NPL 1) discloses ultra-precision processing of a PCD (diamond sintered body) using UV-assisted polishing. As the chemical processing method, Applied Physics, Vol. 77, No. 4, April 2008, pp. 383-389 (NPL 2) discloses processing of a solid material using a low-frequency atmospheric pressure microplasma jet. New Diamond and Frontier Carbon Technology, Vol. 13, No. 1, 2003 January, pp. 19-30 (NPL 3) discloses processing of single crystal diamond using RIE (reactive ion etching).

CITATION LIST

Non Patent Literature

NPL 1: Journal of the Japan Society for Abrasive Technology, Vol. 53, No. 4, April 2009, pp. 242-247

NPL 2: Applied Physics, Vol. 77, No. 4, April 2008, pp. 383-389

NPL 3: New Diamond and Frontier Carbon Technology, Vol. 13, No. 1, 2003 January, pp.19-30

SUMMARY OF INVENTION

A method for producing a body obtained by processing a solid carbon-containing material according to one aspect of the present disclosure, the method includes: a step of preparing the solid carbon-containing material composed of a material having at least a surface containing solid carbon; a step of forming a gas phase fluid containing at least one of an active gas or an active plasma which is active against the solid carbon; and a step of processing the solid carbon-containing material by injecting the gas phase fluid onto at least a part of the surface of the solid carbon-containing material.

An apparatus for producing a body obtained by processing a solid carbon-containing material according to one aspect of the present disclosure is an apparatus for producing a body obtained by processing a solid carbon-containing material used in the method according to the aspect, the apparatus including: a material holding part configured to hold the solid carbon-containing material; a fluid forming part configured to form a gas phase fluid; a fluid injection part including an injection port configured to inject the gas phase fluid; and a control part configured to control at least one position of the solid carbon-containing material or the injection port.

A body obtained by processing a solid carbon-containing material according to an aspect of the present disclosure, the body having at least a processed surface composed of a material containing solid carbon, wherein: the processed surface includes a recessed part bowing inward, and a protrusion part bowing outward; and a total area of the recessed part is greater or equal to 60% of a total area of the processed surface when the processed surface is viewed from a direction perpendicular to a least-square plane thereof.

DETAILED DESCRIPTION

Problem to be Solved by the Present Disclosure

The mechanical processing method disclosed in Journal of the Japan Society for Abrasive Technology, Vol. 53, No. 4, April 2009, pp. 242-247 (NPL 1) can provide a smooth processed surface to allow precise processing, but the hardness of a solid carbon-containing material such as diamond varies depending on a plane orientation thereof. Disadvantageously, it takes a long time to process a solid carbon-containing material in a high hardness plane orientation.

Chemical processing methods using reactive ions disclosed in Applied Physics, Vol. 77, No. 4, April 2008, pp. 383-389 (NPL 2) and New Diamond and Frontier Carbon Technology, Vol. 13, No. 1, 2003 January, pp. 19-30 (NPL 3) allow short processing regardless of the high or low hardness depending on the plane orientation of a solid carbon-containing material such as diamond. However, disadvantageously, steep steps and/or fine protrusions remain in the processed surface, which cannot provide smooth processing.

Accordingly, it is an object of the present invention to solve the above-described problems, to provide a method and apparatus for producing a body obtained by processing a solid carbon-containing material, which can smoothly process the surface of the solid carbon-containing material in a short time regardless of a plane orientation thereof, and a body obtained by processing a solid carbon-containing material, the body produced thereby and having a smooth surface.

Advantageous Effects of Present Disclosure

According to the above, there can be provided a method and apparatus for producing a body obtained by processing a solid carbon-containing material, which can smoothly process the surface of the solid carbon-containing material in a short time, and a body obtained by processing a solid carbon-containing material, the body produced thereby and having a smooth surface.

Description of Embodiments

First, embodiments of the present disclosure will be listed and described.

[1] A method for producing a body obtained by processing a solid carbon-containing material according to an embodiment of the present disclosure, the method includes: preparing the solid carbon-containing material composed of a material having at least a surface containing solid carbon; forming a gas phase fluid containing at least one of an active gas or an active plasma which is active against the solid carbon; and processing the solid carbon-containing material by injecting the gas phase fluid onto at least a part of the surface of the solid carbon-containing material. The method of the present embodiment can smoothly process the surface of the solid carbon-containing material in a short time regardless of a surface orientation thereof.

[2] In the method, when the gas phase fluid is injected onto at least a part of the surface of the solid carbon-containing material, an injection port for the gas phase fluid and the solid carbon-containing material may be relatively moved. The method can more smoothly process the surface of the solid carbon-containing material in a short time regardless of a surface orientation thereof.

[3] In the method, an atmospheric pressure at which the gas phase fluid is injected may be greater than or equal to 0.2 atm. The method can more smoothly process the surface of the solid carbon-containing material in a short time regardless of a surface orientation thereof.

[4] In the method, the gas phase fluid may be a thermal fluid having a temperature of higher than or equal to 300° C. The method can more smoothly process the surface of the solid carbon-containing material in a short time regardless of a surface orientation thereof.

[5] In the method, the active plasma may be excited by at least one of high frequency discharge of greater than or equal to 0.2 MHz and less than or equal to 5 GHz, radio wave arc discharge, or direct current arc discharge before being injected from the injection port. The method can efficiently excite the active plasma.

[6] In the method, the active plasma may contain at least any excited species of at least any ion and radical selected from the group consisting of $O_2$, $CO_2$, CO, $NO_2$, $N_2O$, $H_2O$, and $H_2$. The method has the active plasma which is particularly active against the solid carbon, whereby the surface of the solid carbon-containing material can be more smoothly processed in a short time regardless of a surface orientation thereof.

[7] In the method, the active gas may contain at least any molecule selected from the group consisting of $O_2$, $CO_2$, CO, $NO_2$, $N_2O$, $H_2O$, and $H_2$. The method has the active gas which is particularly active against the solid carbon, whereby the surface of the solid carbon-containing material can be more smoothly processed in a short time regardless of a surface orientation thereof.

[8] In the method, the injection port for the gas phase fluid may have a diameter of less than 1 cm. In the method, the flow rate of the gas phase fluid is increased to spread the gas phase fluid in a direction parallel to the surface of the solid carbon-containing material, whereby the surface of the solid carbon-containing material can be more smoothly processed in a short time regardless of a surface orientation thereof.

[9] In the method, the solid carbon-containing material may have at least a surface containing at least one of SP3-combined solid carbon or SP2-combined solid carbon. The method can more smoothly process the surface of the solid carbon-containing material containing, in at least its surface, at least one of SP3-combined solid carbon or SP2-combined solid carbon in a short time regardless of a surface orientation thereof.

[10] In the method, the solid carbon-containing material may have at least a surface containing at least one of single crystal diamond or polycrystalline diamond. The method can more smoothly process the surface of the solid carbon-containing material containing, in at least its surface, at least one of single crystal diamond or polycrystalline diamond in a short time regardless of a surface orientation thereof.

[11] In the method, the solid carbon-containing material may have at least a surface having a laminated structure of a layer containing at least one of single crystal diamond or polycrystalline diamond and a layer containing graphite. The method can more smoothly process the surface of the solid carbon-containing material having, in at least its surface, a laminated structure of a layer containing at least one of single crystal diamond or polycrystalline diamond and a layer containing graphite in a short time regardless of a surface orientation thereof.

[12] An apparatus for producing a body obtained by processing a solid carbon-containing material according to another embodiment of the present disclosure is an apparatus for producing a body obtained by processing a solid carbon-containing material used in the method according to the embodiment, the apparatus includes: a material holding part configured to hold the solid carbon-containing material; a fluid forming part configured to form a gas phase fluid; a fluid injection part including an injection port configured to inject the gas phase fluid; and a control part configured to control at least one position of the solid carbon-containing material or the injection port. The apparatus of the present embodiment can more smoothly process the surface of the solid carbon-containing material in a short time regardless of a surface orientation thereof.

[13] A body obtained by processing a solid carbon-containing material according to still another embodiment of the present disclosure, the body has at least a processed surface (refer to a surface processed by the method according to the embodiment 1, the same shall apply hereinafter) composed of a material containing solid carbon, wherein: the processed surface includes a recessed part bowing inward, and a protrusion part bowing outward; and a total area of the recessed part is greater than or equal to 60% of a total area of the processed surface when the processed surface is viewed from a direction perpendicular to a least-square plane thereof In the body of the present embodiment, the processed surface is smooth regardless of a surface orientation thereof. Here, the recessed part (portion bowing inward) means a portion where the contact surface is inside the body obtained by processing a solid carbon-containing material. The protrusion part (portion bowing outward) means a portion where the contact surface is outside the body obtained by processing a solid carbon-containing material. A portion of the contact surface at the boundary between the recessed part and the protrusion part is inside the body obtained by processing a solid carbon-containing material, and the other portion is inside the body obtained by processing a solid carbon-containing material.

[14] In the body, at least the processed surface may contain at least one of single crystal diamond or polycrystalline diamond. The body also has a smooth processed surface regardless of a surface orientation thereof.

[15] In the body, at least the processed surface may have a laminated structure of a layer containing at least one of single crystal diamond or polycrystalline diamond and a layer containing greater than or equal to 10% of SP2-combined solid carbon in percentage of intensity of a G band with respect to a D band in Raman scattering spectroscopy. The body also has a smooth processed surface regardless of a surface orientation thereof.

[16] In the body, the layer containing the SP2-combined solid carbon may be present in a stripe pattern on the processed surface. The body also has a smooth processed surface regardless of a surface orientation thereof.

[17] In the body, a maximum height difference between the recessed part and the protrusion part in the processed surface may be less than or equal to 30 μm. The body has a processed surface which is flat and smooth regardless of a surface orientation thereof.

[18] In the body, the recessed part in the processed surface may have a dimple shape. The body also has a smooth processed surface regardless of a surface orientation thereof.

[19] In the body, the dimple shape of the recessed part in the processed surface may be a line shape. The body also has a smooth processed surface regardless of a surface orientation thereof.

Details of Embodiment of Present Disclosure

Embodiment 1: Method for Producing Body Obtained by Processing Solid Carbon-Containing Material With reference to FIGS. 1 and 2, a method for producing a body obtained by processing a solid carbon-containing material according to the present embodiment includes: step S10 of preparing a solid carbon-containing material 10 composed of a material having at least a surface containing solid carbon; step S20 of forming a gas phase fluid F containing at least one of an active gas or an active plasma which are active against the solid carbon; and step S30 of processing solid carbon-containing material 10 by injecting gas phase fluid F onto at least a part of the surface of solid carbon-containing material 10. The method of the present embodiment can smoothly process the surface of the solid carbon-containing material in a short time regardless of a surface orientation thereof. That is, the method for producing a body obtained by processing a solid carbon-containing material of the present embodiment provides the body obtained by processing a solid carbon-containing material and having a surface smoothly processed regardless of a surface orientation thereof in a short time.

Here, "the material having at least a surface containing solid carbon" corresponds to a material in which at least the surface of the material contains solid carbon, that is, any of a material in which at least the whole surface of the material contains solid carbon and a material in which at least a part of the surface of the material contains solid carbon. The whole surface of a portion to be processed by the method of the present embodiment is most preferably solid carbon. That is, "the material having at least a surface containing solid carbon" corresponds to a material having a whole surface composed of solid carbon such as SP3-combined solid carbon (such as diamond) and SP2-combined solid carbon (such as graphite) (for example, a laminated structure material in which a layer composed of solid carbon is formed on the surface of a layer composed of a material other than solid carbon, and the like), a material in which a part of the surface of the material is composed of solid carbon such as SP3-combined solid carbon (such as diamond) and SP2-combined solid carbon (such as graphite) (for example, an embedded structure material in which a material composed of solid carbon is embedded in a part of the surface of a layer composed of a material other than solid carbon, and the like).

The method for producing a body obtained by processing a solid carbon-containing material according to the present embodiment is characterized in that the surface of the solid carbon-containing material can be freely processed using the gas phase fluid injected onto at least a part of the surface of the solid carbon-containing material to form a desired shape. Such a feature makes it possible to provide a flat and smooth irregularities shape using irregularities (undulating) information in the surface. If information on the parallelism of the substrate is used, the parallelism can be set to 0° or controlled within a given angle. Furthermore, it is possible to form a convex surface such as a lens from a flat surface. Not only a flat surface but also various shapes can be formed.

(Step of Preparing Solid Carbon-Containing Material)

Figure 1:
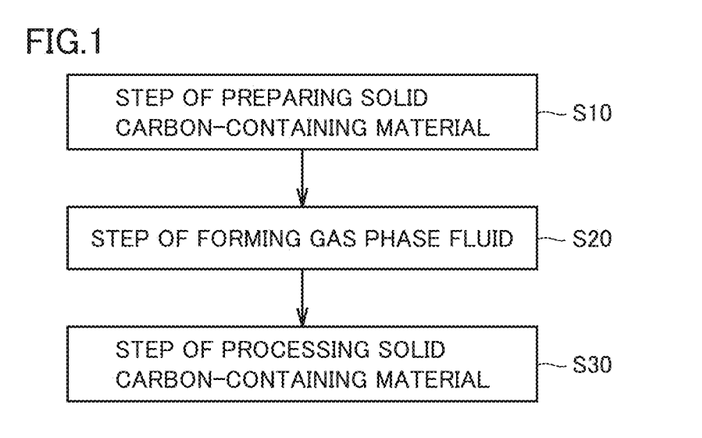
FIG. 1 is a flowchart showing an example of a method for producing a body obtained by processing a solid carbon-containing material according to one aspect of the present disclosure.

Solid carbon-containing material 10 prepared in step S10 of preparing a solid carbon-containing material is composed of a material having at least a surface containing solid carbon. Here, the solid carbon refers to carbon which exists as a solid, and includes SP3-combined carbon bonded by a SP3 hybrid orbital, and SP2-combined carbon bonded by a SP2 hybrid orbital, and the like. Examples of crystalline solid carbon in which the positions of all carbon atoms can be defined include diamond (SP3-combined carbon), graphite (SP2-combined carbon), and graphene (SP2-combined carbon). Examples of amorphous solid carbon include diamond-like carbon (DLC), glassy carbon, carbon black, activated carbon, and carbon fiber.

Figure 3:
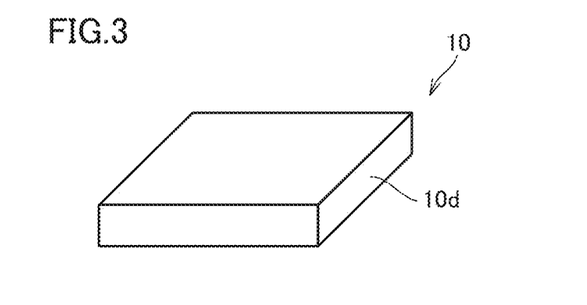
FIG. 3 is a schematic three-dimensional view showing an example of a solid carbon-containing material used in a method for producing a body obtained by processing a solid carbon-containing material according to one aspect of the present disclosure.
Figure 4:
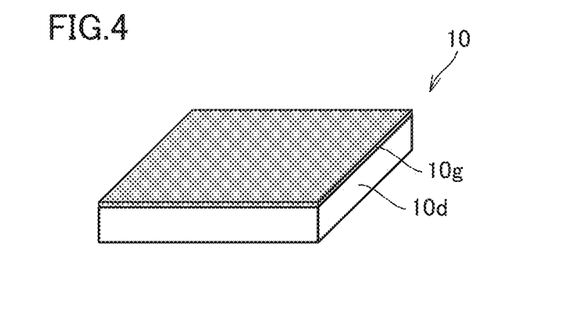
FIG. 4 is a schematic three-dimensional view showing an example of a solid carbon-containing material used in a method for producing a body obtained by processing a solid carbon-containing material according to one aspect of the present disclosure.
Figure 5:
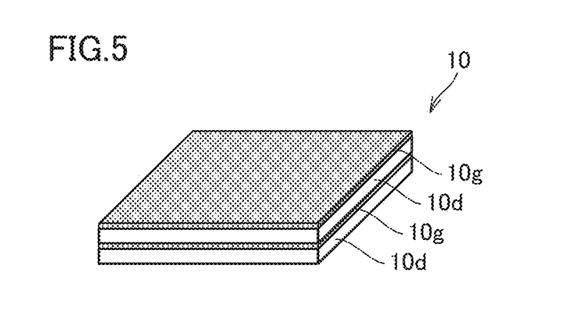
FIG. 5 is a schematic three-dimensional view showing an example of a solid carbon-containing material used in a method for producing a body obtained by processing a solid carbon-containing material according to one aspect of the present disclosure.

With reference to FIGS. 3 to 5, solid carbon-containing material 10 may have at least a surface containing at least one of SP3-combined solid carbon (for example, diamond 10*d*) or SP2-combined solid carbon (for example, graphite 10*g*). Even if solid carbon-containing material 10 contains at least one of SP3-combined solid carbon or SP2-combined solid carbon, the surface of solid carbon-containing material 10 can be more smoothly processed in a short time regardless of a surface orientation thereof.

With reference to FIG. 3, solid carbon-containing material 10 may have at least a surface containing diamond 10d, that is, at least one of single crystal diamond or polycrystalline diamond. Even if solid carbon-containing material 10 contains at least one of single crystal diamond or polycrystalline diamond, the surface of solid carbon-containing material 10 can be more smoothly processed in a short time regardless of a surface orientation thereof.

With reference to FIGS. 4 and 5, solid carbon-containing material 10 may have at least a surface having a laminated structure of a layer containing at least one of single crystal diamond or polycrystalline diamond (diamond 10d) and a layer containing graphite 10g. Even if at least the surface of solid carbon-containing material 10 has a laminated structure of a layer containing at least one of single crystal diamond or polycrystalline diamond (diamond 10d) and a layer containing graphite 10g, the surface of solid carbon-containing material 10 can be more smoothly processed in a short time regardless of a surface orientation thereof. Here, any of the layer containing diamond 10d and the layer containing graphite 10g may be exposed on the surface, but from the viewpoint that the layers can be applied to a technique of converting the surface of diamond into graphite and processing the surface, it is preferable that the layer containing graphite 10g is disposed on the layer containing diamond 10d.

(Step of Forming Gas Phase Fluid)

Gas phase fluid F formed in step S20 of forming gas phase fluid F contains at least one of a gas and a plasma which are active against the solid carbon. Gas phase fluid F facilitates the processing of solid carbon-containing material 10 in a chemical reaction with the solid carbon in solid carbon-containing material 10.

The gas which is active against the solid carbon is not particularly limited, but the gas preferably contains a molecule which contains an element easily chemically reacting with the solid carbon (for example, oxygen or hydrogen). The gas preferably contains at least any molecule selected from the group consisting of $O_2$, $CO_2$, CO, $NO_2$, $N_2O$, $H_2O$, and $H_2$.

The plasma which is active against the solid carbon is not particularly limited, but the plasma preferably contains excited species of at least any of an ion and a radical which contain an element easily chemically reacting with the solid carbon (for example, oxygen or hydrogen). The plasma preferably contains at least any excited species of at least any ion and radical selected from the group consisting of $O_2$, $CO_2$, CO, $NO_2$, $N_2O$, $H_2O$, and $H_2$. These excited species are preferably excited by at least one method of high frequency discharge of greater than or equal to 0.2 MHz and less than or equal to 5 GHz, RF (radio wave) arc discharge, or DC (direct current) arc discharge before being injected from an injection port. By these methods, excited species having sufficient energy to process the solid carbon-containing material even at atmospheric pressure are easily obtained.

(Step of Processing Solid Carbon-Containing Material)

In step S30 of processing solid carbon-containing material 10, gas phase fluid F is injected onto at least a part of the surface of solid carbon-containing material 10. Gas phase fluid F is preferably a gas and/or plasma viscous fluid from the viewpoint of smoothly processing the surface of solid carbon-containing material 10 in a short time. Here, the viscous fluid refers to a fluid having an interaction between gas and/or plasma particles. A gas having a difference depending on the type of a gas and having a pressure of greater than or equal to 13 kPa is considered to be substantially the viscous fluid.

Gas phase fluid F is injected onto at least a part of the surface of the solid carbon-containing material 10. Thereby, a flow in a direction parallel to the surface of solid carbon-containing material 10 (also referred to as a lateral flow, the same shall apply hereinafter) is formed in at least a part of injected gas phase fluid F. Conventionally, in processing using an active gas and/or an active plasma, the flow of the active gas and/or the active plasma is tolerated by a convection flow and the like without being controlled, so that the removal of the low hardness portion (weak portion) of the surface of the solid carbon-containing material is large, and the removal of the high hardness portion (strong portion) of the surface is small. Therefore, large irregularities (such as steep steps and/or fine protrusions) remain in the processed surface, which have a problem that smooth processing cannot be provided. Meanwhile, in the present embodiment, by forming the lateral flow of gas phase fluid F, the surface is removed so as to sweep away from the side without distinguishing the high hardness portion (strong portion) and the low hardness portion (weak portion) of the surface, whereby large irregularities do not remain in the processed surface, which can provide smooth processing. The plasma is conventionally generated in a normal vacuum (for example, about 0.133 Pa to 1.33 kPa). However, in the present embodiment, the plasma can be generated even at atmospheric pressure, whereby the lateral flow of gas phase fluid F containing a plasma can be formed in the same manner as in the above.

Figure 2:
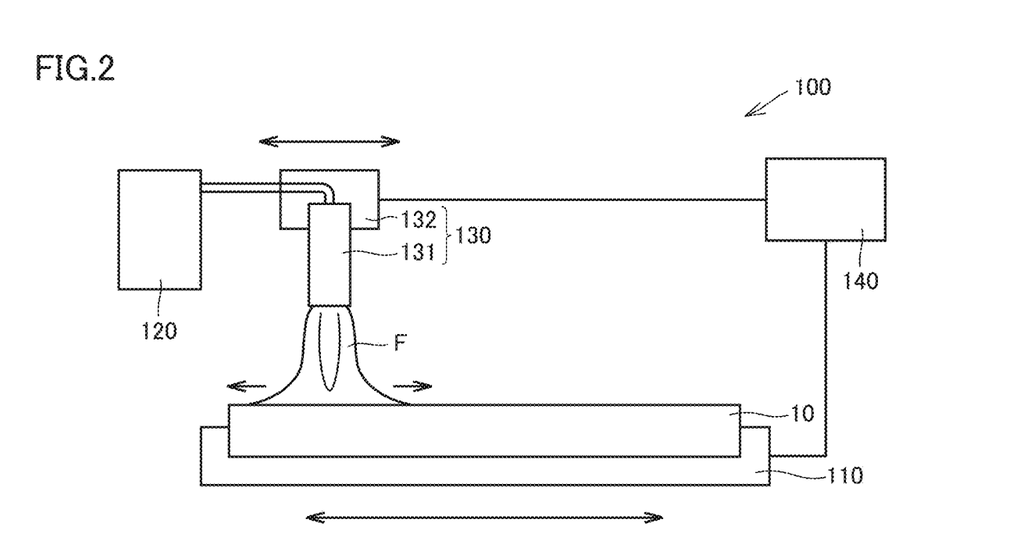
FIG. 2 is a schematic side view showing an example of a method and apparatus for producing a body obtained by processing a solid carbon-containing material according to one aspect of the present disclosure.

With reference to FIG. 2, when gas phase fluid F is injected onto at least a part of the surface of solid carbon-containing material 10, gas phase fluid F is scanned by controlling the position of an injection port 131, whereby the portion to be processed by the injection of gas phase fluid F can be spread from at least a part of the surface to the whole. For example, gas phase fluid F is injected onto the high hardness portion (strong portion) of the surface of solid carbon-containing material 10 for a long time, and gas phase fluid F is injected onto the low hardness portion (weak portion) of the surface of solid carbon-containing material 10 for a short time, which can provide smoother processing. Gas phase fluid F is injected onto a portion which is desired to be deeply processed in solid carbon-containing material 10 for a long time, and gas phase fluid F is injected onto a portion which is desired to be shallowly processed in solid carbon-containing material 10 for a short time, whereby solid carbon-containing material 10 can be processed in a desired shape. From the viewpoint of easily processing solid carbon-containing material 10 in a desired shape, gas phase fluid F is preferably injected onto a part (not the whole but a part) of the surface of solid carbon-containing material 10.

The injection direction of gas phase fluid F may be a direction perpendicular to the surface of solid carbon-containing material 10 as shown in FIG. 2, but from the viewpoint of promoting the formation of the lateral flow of gas phase fluid F, the injection direction may be a direction inclined from a direction perpendicular to the surface of solid carbon-containing material 10.

With reference to FIG. 2, in step S30 of processing solid carbon-containing material 10, from the viewpoint of promoting the formation of the lateral flow and/or from the viewpoint of spreading a portion to be processed by injecting gas phase fluid F from at least part of the surface to the whole, when gas phase fluid F is injected onto at least a part of the surface of solid carbon-containing material 10, injection port 131 of gas phase fluid F and solid carbon-containing material 10 can be relatively moved. That is, injection port 131 of gas phase fluid F (that is, the injection position of gas phase fluid F) and solid carbon-containing material 10 may be relatively moved. Any of injection port 131 of gas phase fluid F and solid carbon-containing material 10 may be moved, or both injection port 131 of gas phase fluid F and solid carbon-containing material 10 may be moved. For example, if solid carbon-containing material 10 is rotated relative to injection port 131 of gas phase fluid F when gas phase fluid F is injected onto at least a part of the surface of solid carbon-containing material 10, the outward formation of the lateral flow of gas phase fluid F injected onto at least a part of the surface of solid carbon-containing material 10 is promoted by a centrifugal force. When solid carbon-containing material 10 is moved in a specific direction relative to injection port 131 of gas phase fluid F when gas phase fluid F is injected onto at least a part of the surface of solid carbon-containing material 10, the formation of the lateral flow in the direction opposite to the moving direction, of gas phase fluid F injected onto at least a part of the surface of solid carbon-containing material 10 is promoted by an inertial force. That is, the lateral flow speed and stay injection time of gas phase fluid F can be controlled by the rotation speed or movement speed of solid carbon-containing material 10.

In step S30 of processing solid carbon-containing material 10, from the viewpoint of more smoothly processing the surface of the solid carbon-containing material in a short time regardless of a surface orientation thereof using gas phase fluid F as a viscous fluid, an atmospheric pressure at which gas phase fluid F is injected is preferably greater than or equal to 0.2 atm. From the viewpoint of injecting gas phase fluid F as the viscous fluid, the pressure of gas phase fluid F to be injected is preferably greater than the atmospheric pressure. The pressure is preferably greater than or equal to 0.5 atm, more preferably 1 atm, and still more preferably greater than or equal to 1.5 atm.

In step S30 of processing solid carbon-containing material 10, from the viewpoint of more smoothly processing the surface of the solid carbon-containing material in a short time regardless of a surface orientation thereof by promoting the chemical reaction between gas phase fluid F and solid carbon in solid carbon-containing material 10, gas phase fluid F is preferably a thermal fluid having a temperature of higher than or equal to 300° C., more preferably a thermal fluid having a temperature of higher than or equal to 600° C., still more preferably a thermal fluid having a temperature of greater than or equal to 800° C., yet still more preferably a thermal fluid having a temperature of higher than or equal to 1000° C., and further preferably a thermal fluid having a temperature of higher than or equal to 1200° C.

In step S30 of processing solid carbon-containing material 10, from the viewpoint of more smoothly processing the surface of the solid carbon-containing material in a short time regardless of a surface orientation, thereof by increasing the flow rate of the gas phase fluid to spread the gas phase fluid in a direction parallel to the surface of the solid carbon-containing material, the diameter of the injection port for the gas phase fluid is preferably less than 1 cm, more preferably less than 1 mm, and still more preferably less than 0.2 mm. From the viewpoint of using gas phase fluid F as the viscous fluid, the diameter of the injection port for the gas phase fluid is preferably greater than or equal to 1 μm, more preferably greater than or equal to 100 μm, and still more preferably greater than or equal to 500 μm.

In the step of processing solid carbon-containing material 10, from the viewpoint of more smoothly processing the surface of the solid carbon-containing material in a short time regardless of a surface orientation thereof by promoting the chemical reaction between gas phase fluid F and the solid carbon in solid carbon-containing material 10, the temperature of solid carbon-containing material 10 (specifically, the temperature of a material holding part 110 configured to hold solid carbon-containing material 10) is preferably higher than or equal to 400° C. at atmospheric pressure, preferably higher than or equal to 600° C. in a low vacuum of higher than or equal to 0.133 Pa ($1 \times 10^{-3}$ Torr), and preferably higher than or equal to 1000° C. in a high vacuum of lower than 0.133 Pa ($1 \times 10^{-3}$ Torr).

Embodiment 2: Apparatus for Producing Body Obtained by Processing Solid Carbon-Containing Material With reference to FIG. 2, an apparatus 100 for producing a body obtained by processing a solid carbon-containing material according to the present embodiment is an apparatus 100 for producing a body obtained by processing a solid carbon-containing material used in the method according to the embodiment 1. The apparatus 100 includes a material holding part 110 configured to hold solid carbon-containing material 10, a fluid forming part 120 configured to form a gas phase fluid F, a fluid injection part 130 including an injection port 131 configured to inject gas phase fluid F, and a position control part 140 configured to control at least one position of solid carbon-containing material 10 and injection port 131. The apparatus of the present embodiment can more smoothly process the surface of the solid carbon-containing material in a short time regardless of a surface orientation thereof.

(Material Holding Part)

Material holding part 110 is a portion configured to hold solid carbon-containing material 10. Material holding part 110 preferably includes a mechanism for moving solid carbon-containing material 10 relative to injection port 131 for gas phase fluid F, and a mechanism for heating solid carbon-containing material 10 to a predetermined temperature.

(Fluid Forming Part)

Fluid forming part 120 is a portion forming gas phase fluid F containing at least one of a gas or a plasma which are active against solid carbon. Fluid forming part 120 preferably includes at least one of a high frequency discharge device of greater than or equal to 0.2 MHz and less than or equal to 5 GHz, an RE arc discharge device, or a DC (direct current) arc discharge device in order to form an active plasma.

(Fluid Injection Part)

Fluid injection part 130 includes injection port 131 configured to inject gas phase fluid F and an injection port holding part 132 configured to hold the injection port. Injection port holding part 132 preferably includes a mechanism for moving injection port 131 for gas phase fluid F relative to solid carbon-containing material 10, a mechanism for changing the inclined angle of the axis of injection port 131 in a direction perpendicular to the surface of solid carbon-containing material 10, and a mechanism for heating gas phase fluid F to a predetermined temperature.

(Position Control Part)

Position control part 140 includes a mechanism for controlling at least one position of solid carbon-containing material 10 and injection port 131.

Embodiment 3: Body Obtained by Processing Solid Carbon-Containing Material

Figure 6:
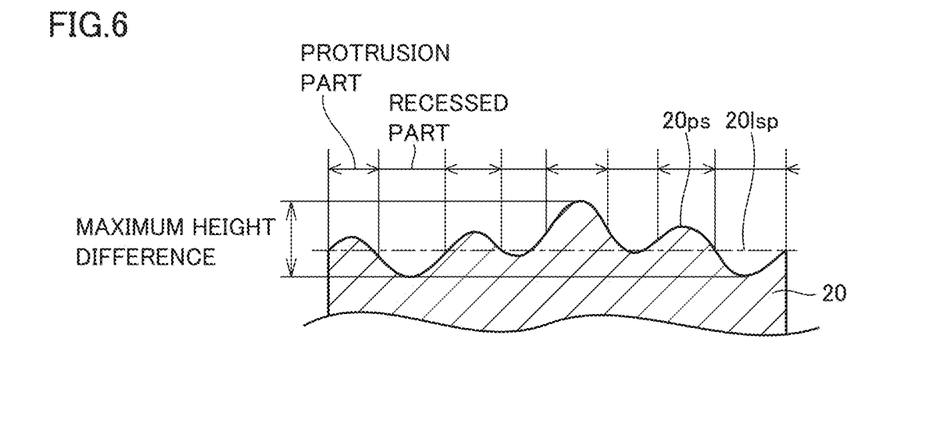
FIG. 6 is a schematic cross-sectional view showing an example of a part of a body obtained by processing a solid carbon-containing material according to one aspect of the present disclosure.

With reference to FIG. 6, a body obtained by processing a solid carbon-containing material according to the present embodiment is a body obtained by processing a solid carbon-containing material 20, the body having at least a processed surface 20ps (a surface processed by the method of the embodiment 1) composed of a material containing solid carbon, wherein: processed surface 20ps includes a recessed part bowing inward, and a protrusion part bowing outward; and a total area of the recessed part is greater than or equal to 60% of a total area of processed surface 20ps when processed surface 20ps is viewed from a direction perpendicular to a least-square plane 201sp thereof. The body obtained by processing a solid carbon-containing material of the present embodiment has a smooth surface regardless of a surface orientation thereof. Here, the recessed part (portion bowing inward) means a portion where the contact surface is inside the body obtained by processing a solid carbon-containing material. The protrusion part (portion bowing outward) means a portion where the contact surface is outside the body obtained by processing a solid carbon-containing material. A portion of the contact surface at the boundary between the recessed part and the protrusion part is inside the body obtained by processing a solid carbon-containing material, and the other portion is inside the body obtained by processing a solid carbon-containing material.

Body obtained by processing a solid carbon-containing material 20 of the present embodiment can be produced by the method of the embodiment 1 and the apparatus of the embodiment 2. Here, the areas of the recessed part, protrusion part, and processed surface 20ps (the whole of the recessed part and protrusion part) are measured with, for example, a scanning white light interferometer manufactured by Canon Inc. From the viewpoint that processed surface 20ps of body obtained by processing a solid carbon-containing material 20 is smooth regardless of a surface orientation thereof, when processed surface 20ps is viewed from the direction perpendicular to least-square plane 201sp thereof, the total area of the recessed part is greater than or equal to 60% of the total area of the processed surface, preferably greater than or equal to 70% of the total area of the processed surface, and preferably less than or equal to 80% of the total area of the processed surface. Here, the percentage of the total area of the recessed part relative to the total area of the processed surface is also referred to as the recessed part area ratio of the processed surface. That is, the recessed part area ratio of the processed surface is greater than or equal to 60%, preferably greater than or equal to 70%, and preferably less than or equal to 80%.

In body obtained by processing a solid carbon-containing material 20 of the present embodiment, from the viewpoint of the high crystal quality of the processed surface, the size of the processed surface is preferably greater than or equal to 1 mm square, and the density of polishing damage points in the processed surface is preferably less than or equal to 10 points/mm$^2$. Here, the density of polishing damage points in the processed surface appears as polycrystalline particles (particles stacked in mismatch) of greater than or equal to 1 μm which are confirmed by epitaxially growing diamond by 5 μm on the surface of the processed body. By counting this, the density of polishing damage points can be evaluated. Diamond may be typically formed at a methane concentration of 3%, a pressure of $1.33 \times 10^4$ Pa, a microwave power of greater than or equal to 3 kW, and a substrate temperature of 950° C. A condition in which single crystal diamond can be formed is preferable. These are confirmed on a single crystal diamond substrate. On a polycrystalline diamond substrate having a particle diameter of greater than or equal to 50 μm, polycrystalline particles of greater than or equal to 1 μm and less than 10 μm which are confirmed by crystal-growing diamond by 5 μm are counted, whereby the density of polishing damage points can be evaluated. In the growth condition of the diamond in this case, typically, the diamond is preferably formed at a methane concentration of 3%, a pressure of $1.33 \times 10^4$ Pa, a microwave power of greater than or equal to 6 kW, and a substrate temperature of 1000° C. A condition for forming polycrystalline diamond having less graphite in Raman spectroscopic analysis (condition in which G band is 1/100 of the peak of the diamond) is preferable. The polycrystalline diamond having a particle diameter of less than 50 μm or the other body obtained by processing a solid carbon-containing material can be evaluated by the density of polishing scratches exceeding 1 mm and observed in the surface with a differential interference microscope. In that case, 1 scratch/mm$^2$ may be converted as 1 piece/mm$^2$.

In body obtained by processing a solid carbon-containing material 20, from the viewpoint that the processed surface is flat and smooth regardless of a surface orientation thereof, a maximum height difference in the whole surface of processed surface 20ps which is intentionally smoothly processed is preferably less than or equal to 30 μm, more preferably less than or equal to 20 μm, still more preferably less than or equal to 10 μm, yet still more preferably less than or equal to 1 μm, and particularly preferably less than or equal to 0.1 μm. Body obtained by processing a solid carbon-containing material 20 includes unintended periodic recessed parts and protrusion parts formed by processing in the method of the embodiment 1. The maximum height difference between the unintentionally formed recessed part and protrusion part is preferably less than or equal to 30 μm, more preferably less than or equal to 20 μm, more preferably less than or equal to 10 μm, still more preferably less than or equal to 1 μm, and particularly preferably less than or equal to 0.1 μm.

Figure 7:
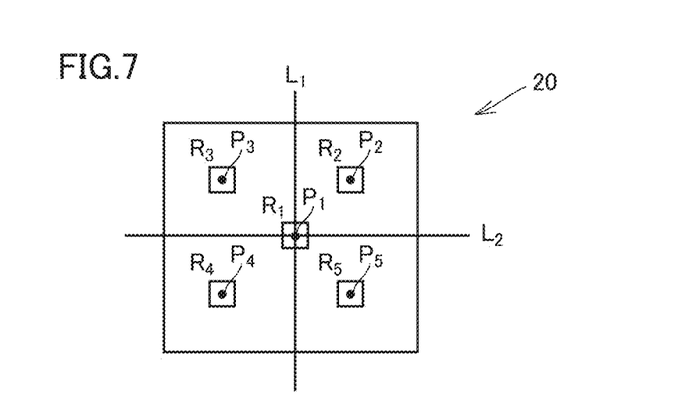
FIG. 7 is a schematic plan view showing an example of a range in which a maximum height difference of a processed surface of a body obtained by processing a solid carbon-containing material according to one aspect of the present disclosure is measured with a scanning white interferometer.

The maximum height difference between the recessed part and protrusion part in the whole surface of the processed surface which is intentionally smoothly processed, and the maximum height difference between the recessed part and protrusion part which are unintentionally formed in the processed surface can be measured with a laser displacement meter (for example, a surface shape measuring system Dyvoce-3000 manufactured by Kohzu Precision Co., Ltd., or its equivalent). However, since the accuracy of height difference measurement with the laser displacement meter is about 1 μm, a scanning white light interferometer (for example, (Zygo) NewView 200 manufactured by Canon Inc. or its equivalent) is suitably used for measuring the height difference of less than 1 The scanning white light interferometer causes difficult measurement of the maximum height difference in a wide area, and makes measurements in a plurality of narrow areas. For example, with reference to FIG. 7, the maximum height difference provided by the scanning white light interferometer is taken as a maximum height difference measured and obtained in five ranges $R_1$, $R_2$, $R_3$, $R_4$, $R_5$ of 0.4-mm square (referred to as a square having a side of 0.4 mm, the same shall apply hereinafter) centered on a centroid point $P_1$ of processed surface 20ps to be measured and four centroid points $P_2$, $P_3$, $P_4$, $P_5$ of four areas divided by two straight lines $L_1$ and $L_2$ orthogonal to each other at centroid point $P_1$.

In body obtained by processing a solid carbon-containing material 20 of the present embodiment, processed surface 20ps refers to a surface formed by intended processing according to the method of the embodiment 1. A flat surface and a curved surface and the like are also included in the processed surface. The flat processed surface refers to the same plane within a given accuracy range. The processed surface of the curved surface refers to a spherical surface, or a quadratic or cubic paraboloidal surface. Therefore, a surface which is not mounted on the intended processed surface formed by the method of the embodiment 1 is a non-processed surface. These can be identified by statistically processing the height of the surface. The surface of a flat portion in a surface having random irregularities is the processed surface, and a recessed portion having an intended shape in a flat surface is also the processed surface. That is, the surface of the intended processed surface formed by the method of the embodiment 1 is the processed surface.

In body obtained by processing a solid carbon-containing material 20, at least the processed surface can contain at least one of single crystal diamond or polycrystalline diamond. The body also has a smooth processed surface regardless of a surface orientation thereof. Body obtained by processing a solid carbon-containing material 20 is obtained by processing solid carbon-containing material 10 having at least a surface containing at least one of single crystal diamond or polycrystalline diamond (diamond 10d) as shown in FIG. 3 according to the method of the embodiment 1.

Body obtained by processing a solid carbon-containing material 20 may have at least a processed surface having a laminated structure of a layer containing at least one of single crystal diamond or polycrystalline diamond and a layer containing greater than or equal to 10% of SP2-combined solid carbon in percentage of intensity of a G band with respect to a D band in Raman scattering spectroscopy. The body also has a smooth processed surface regardless of a surface orientation thereof. The ratio (%) of the SP2-combined solid carbon in the layer is calculated by the percentage of intensity of a G band with respect to a D band in Raman scattering spectroscopy. Here, the G band is a broad peak of greater than or equal to 1400 cm$^{-1}$ and less than or equal to 1650 cm$^{-1}$, and the D band is a broad peak of greater than or equal to 1335 cm$^{-1}$ and less than 1400 cm$^{-1}$. The term "broad" refers to a peak having a half-value width of greater than or equal to 20 cm$^{-1}$. If both the D band and diamond peak are present, one having higher Raman intensity is used as a denominator. The term "diamond peak" is a sharp peak of greater than or equal to 1325 cm$^{-1}$ and less than 1335 cm$^{-1}$, and the term "sharp refers to a peak of less than 20 cm$^{-1}$. Body obtained by processing a solid carbon-containing material 20 is obtained by processing solid carbon-containing material 10 having a laminated structure of a layer containing at least one of single crystal diamond or polycrystalline diamond and a layer containing greater than or equal to 10% of SP2-combined solid carbon (for example, graphite) as shown in FIG. 5 according to the method of the embodiment 1.

Figure 8:
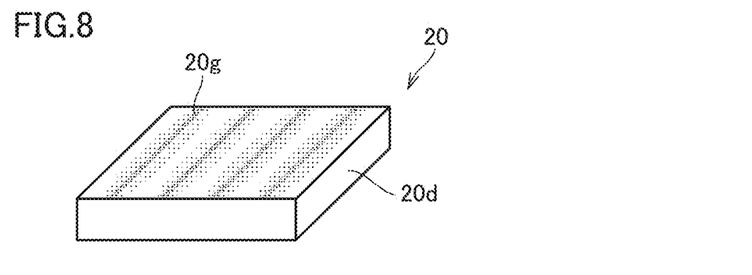
FIG. 8 is a schematic three-dimensional view showing an example of a body obtained by processing a solid carbon-containing material according to one aspect of the present disclosure.

With reference to FIG. 8, in body obtained by processing a solid carbon-containing material 20, the layer containing the SP2-combined solid carbon (that is, SP2-combined solid carbon of greater than or equal to 10% in percentage of intensity of a G band with respect to a D band in Raman scattering spectroscopy) can be present in a stripe pattern on the surface. The body obtained by processing a solid carbon-containing material also has a smooth surface regardless of a surface orientation thereof. Body obtained by processing a solid carbon-containing material 20 is obtained by processing solid carbon-containing material 10 having the laminated structure in which the layer containing greater than or equal to 10% of SP2-combined solid carbon (for example, graphite) is disposed on the layer containing at least one of single crystal diamond or polycrystalline diamond as shown in FIG. 4 according to the method of the embodiment 1.

The body obtained by processing a solid carbon-containing material of the present embodiment is processed by injecting the gas phase fluid onto at least a part of the surface of the solid carbon-containing material as described in the method of the embodiment 1, whereby the recessed parts and the protrusion parts are formed in the processed surface, to easily provide the recessed parts having a dimple shape. Furthermore, not only the vertical flow of fluid injection but also the eventual lateral flow of the fluid may provide a smooth surface shape. Here, the dimple shape means a hollow shape including a part of a spherical surface.

Furthermore, in the body obtained by processing a solid carbon-containing material of the present embodiment, the gas phase fluid which is injected onto at least a part of the surface of the solid carbon-containing material is scanned in the method of the embodiment 1, so that the dimple shape of the recessed part in the processed surface may be a line shape. Similar to the above, not only the vertical flow of fluid injection but also the eventual lateral flow of the fluid may provide a smooth surface shape.

EXAMPLES

Example 1

A solid carbon-containing material was produced by high pressure synthesis, and cut with a laser to prepare an Ib type single crystal diamond substrate of 5 mm×5 mm×a thickness of 1.0 mm. Here, the thickness of the solid carbon-containing material means an average thickness of an average thickness in a line passing through a center parallel to one side of a square sample and an average thickness in a line perpendicular to the line. The square sample is measured with a laser displacement meter (for example, a surface shape measuring system Dyvoce-3000 manufactured by Kohzu Precision Co., Ltd.) in the case of a sample whose surface irregularities are less than 5% of a thickness in 0.5 mmφ. The thickness of the solid carbon-containing material means the average thickness of five points of a center point and four end part points which are 30% of a distance to a center between each of four end points and the center point in the case of a sample whose surface irregularities are greater than or equal to 5% of a thickness in 0.5 mmφ. In this measurement, a palpation type thickness tester having a palpation area of 0.2 to 0.5 minφ is used, so that the maximum height is strictly measured. This is because the sample having rough surface irregularities causes difficult measurement in the reflection of light. In the case of single crystal diamond, the surface irregularities are small and flat, so that the average thickness of the former becomes a main thickness. In the case of polycrystalline diamond, the surface irregularities are large, so that the average thickness of the latter becomes a main thickness. As planarization processing proceeds, the former can be evaluated even in the polycrystal, but the values are the same. Both the surfaces of the substrate were subjected to ordinary general mechanical polishing. A thickness was 0.8 mm; surface average roughness Ra (refer to an arithmetic average height Ra in a roughness curved line specified in JIS B0601: 2013, the same shall apply hereinafter) was less than or equal to 5 nm; and parallelism was 0.2°. The average roughness Ra of the surface was measured with a scanning white interferometer ((Zygo)NewView 200 manufactured by Canon Inc.). The parallelism means the parallelism between the least-square planes of the back and front surfaces of the substrate (deviation angle from parallelism). Specifically, the heights of both the back and front surfaces were measured with a laser displacement meter (surface shape measuring system Dyvoce-3000 manufactured by Kohzu Precision Co., Ltd.), and converted into information on the thickness of the material to calculate the parallelism.

To the material disposed on a material holding part heated to 500° C. and subjected to mechanical polishing, a gas phase fluid containing a plasma in which a gas obtained by mixing Ar gas and $CO_2$ gas in a volume ratio in a standard state (NTP: reference temperature of 273.15 K, standard pressure of 101.325 kPa) of 1:1 was excited by a DC plasma was scanned for 100 minutes while being injected from an injection port having a diameter of 0.5 mm. The plasma injected from the injection port was confirmed to have a temperature of higher than or equal to 200° C. Based on the information on the thickness, a stay injection time was adjusted so as to be longer in a thick portion and shorter in a thin portion. The parallelism of the material after injecting and scanning was 0.05°. As described above, the processing using the gas phase fluid of the embodiment 1 provided a body obtained by processing a solid carbon-containing material, in which both the front and back surfaces were more parallel in a shorter time than processing by mechanical polishing.

The maximum height difference of the surface of the material after injecting and scanning was less than 1 μm as measured with the laser displacement meter, so that the maximum height difference was as small as 0.04 μm as measured with a scanning white interferometer ((Zygo) NewView 200 manufactured by Canon Inc). Here, the maximum height difference in the measurement with the scanning white interferometer was taken as a maximum height difference measured and obtained in five ranges of 0.4-mm square centered on a centroid point of a principal surface and four centroid points of four areas divided by two straight lines orthogonal to each other at the centroid point.

Furthermore, the ratio of the total area of the recessed part to the total area of the processed surface when the processed surface was viewed from a direction perpendicular to the least-square plane thereof was 60% as measured with the laser displacement meter. As described above, a body obtained by processing a solid carbon-containing material, having a processed surface having a small maximum height difference and being smooth (flat and smooth) was obtained in a short time by the processing using the gas phase fluid of the embodiment 1.

Example 2

As a solid carbon-containing material, a single crystal diamond substrate of 5 mm×5 mm×a thickness of 0.5 mm prepared by a chemical vapor deposition (CVD) method was prepared. Here, the thickness refers to the average thickness. Since the surface of the material was still grown, the maximum height difference was 90 μm as measured with a laser displacement meter (surface shape measuring system Dyvoce-3000 manufactured by Kohzu Precision Co., Ltd.). To the material disposed on a material holding part heated to 500° C. and subjected to mechanical polishing, a gas phase fluid containing a plasma in which a gas obtained by mixing Ar gas and $CO_2$ gas in a volume ratio in a standard state (NTP: reference temperature of 273.15 K, standard pressure of 101.325 kPa) of 2:1 was excited by a DC plasma was scanned for 240 minutes while being injected from an injection port having a diameter of 1 mm. Based on the information on the thickness, a stay injection time was adjusted so as to be longer in a thick portion and shorter in a thin portion. The maximum height difference of the surface of the material after injecting and scanning was as small as 20 μm. The ratio of the total area of the recessed part to the total area of the processed surface when the processed surface was viewed from a direction perpendicular to the least-square plane thereof was 70% as measured with the laser displacement meter. As described above, a body obtained by processing a solid carbon-containing material, having a processed surface having a small maximum height difference and being smooth (flat and smooth) was obtained in a short time by the processing using the gas phase fluid of the embodiment 1.

Example 3

A single crystal diamond substrate of 4 mm×4 mm×a thickness of 0.5 mm prepared by the same method as in Example 2 was prepared. Here, the thickness refers to the average thickness. The surface of the material was still grown, but the maximum height difference was 90 μm as measured with a laser displacement meter (surface shape measuring system Dyvoce-3000 manufactured by Kohzu Precision Co., Ltd.). This material was processed in the same manner as in Example 2. The maximum height difference of the surface of the material after the processing was as small as 10 μm as measured with the laser displacement meter. The ratio of the total area of the recessed part to the total area of the processed surface when the processed surface was viewed from a direction perpendicular to the least-square plane thereof was 65% as measured with the laser displacement meter. As described above, a body obtained by processing a solid carbon-containing material, having a processed surface having a small maximum height difference and being smooth (flat and smooth) was obtained in a short time by the processing using the gas phase fluid of the embodiment 1.

Example 4

A single crystal diamond substrate of 5 mm×5 mm×a thickness of 0.5 mm prepared by the same method as in Example 2 was prepared. Here, the thickness refers to the average thickness. The surface of the material was still grown, but the maximum height difference was 70 μm as measured with a laser displacement meter (surface shape measuring system Dyvoce-3000 manufactured by Kohzu Precision Co., Ltd.). This material was annealed in a high vacuum at 1800° C. for 3 hours to form a graphite layer on a diamond surface. The graphite layer on the diamond surface was processed in the same manner as in Example 2. However, a processing time was 12 minutes. Furthermore, the annealing and the graphite processing were repeated 8 times. The maximum height difference of the surface of the material after the processing was as small as 5 μm as measured with the laser displacement meter. The ratio of the total area of the recessed part to the total area of the processed surface when the processed surface was viewed from a direction perpendicular to the least-square plane thereof was 65% as measured with the laser displacement meter. As described above, a body obtained by processing a solid carbon-containing material, having a processed surface having a small maximum height difference and being smooth (flat and smooth) was obtained in a short time by the processing using the gas phase fluid of the embodiment 1.

Example 5

A CVD single crystal diamond substrate of 4 mm×4 mm×a thickness of 0.5 mm prepared by the same method as in Example 2 was prepared. Here, the thickness refers to the average thickness. The surface of the material was still grown, but the maximum height difference was measured with a laser displacement meter (surface shape measuring system Dyvoce-3000 manufactured by Kohzu Precision Co., Ltd.). This material was processed in the same manner as in Example 2. However, a processing fluid type, a processing fluid ratio, and a fluid injection diameter were changed as shown in Table 1. The maximum height difference of the surface of the material after the processing was measured with the laser displacement meter. Based on the information on the thickness, a stay time of plasma irradiation was adjusted so as to be longer in a thick portion and shorter in a thin portion. That is, the stay time was set to be proportional to the height difference. The ratio of the total area of the recessed part to the total area of the processed surface when the processed surface was viewed from a direction perpendicular to the least-square plane thereof (referred to as a recessed part area ratio, the same shall apply hereinafter) was measured with the laser displacement meter. As described above, a body obtained by processing a solid carbon-containing material, having a processed surface having a small maximum height difference and being smooth (flat and smooth) was obtained in a short time by the processing using the gas phase fluid of the embodiment 1.

The obtained processed body is characterized in that the processed surface is dimpled by plasma irradiation, and its diameter depends on the intensity and distance of irradiation. The diameter is greater than or equal to 1/4 of a plasma flow current outlet, and is about a flow current diameter (500 μm to 1000 μm). As the stay time is longer, the diameter of the dimple shape is larger. Here, the dimple shape means a hollow shape including a part of a spherical surface. A spherical or circular shape corresponding to the dimple corresponds to one having a diameter of 1/4 of the hole diameter of the flow current (a hole of a tube from which the plasma is injected) to about the same as the hole diameter. Furthermore, since the plasma irradiation flow current is scanned, processing in a line shape is also characterized. Since the surface is formed by the dimple-shaped depression as described above, the area of the recessed part is larger than the area of the protrusion part. In the case of machine processing, the surface is rubbed, so that the dimple shape is not provided. High frequency (13.56 MHz) was used for the portion generating a plasma. However, it could be confirmed that the plasma fluid is generated even with DC arc or microwave (2.45 GHz), so that the portion can be equally processed under the same conditions as in those in Example 5-3 The results were shown in Table 1.

TABLE 1

| | | Example 5 | Example 5-1 | Example 5-2 | Example 5-3 | Example 5-4 | Example 5-5 | Example 5-6 |
|---|---|---|---|---|---|---|---|---|
| solid carbon-containing material | Type | | Gas phase synthesis diamond | Gas phase synthesis diamond | Gas phase synthesis diamond | Gas phase synthesis diamond | Gas phase synthesis diamond | Gas phase synthesis diamond |
| | Size (mm × mm) | | 4 × 4 | 4 × 4 | 4 × 4 | 4 × 4 | 4 × 4 | 4 × 4 |
| | Front surface condition [front surface/back surface] | | Growth surface/ polishing | Growth surface/ polishing | Growth surface/ polishing | Growth surface/ polishing | Growth surface/ polishing | Growth surface/ polishing |
| | Average thickness (μm) | | 500 | 500 | 500 | 500 | 500 | 500 |
| | Maximum height difference of surface (μm) | | 80 | 90 | 70 | 80 | 90 | 70 |
| Processing of solid carbon-containing material | Processing method | | Plasma gas phase fluid | Plasma gas phase fluid | Plasma gas phase fluid | Plasma gas phase fluid | Plasma gas phase fluid | Plasma gas phase fluid |
| | Processing fluid type | | He + $CO_2$ | He + $O_2$ | Ar + $CO_2$ | Ar + $O_2$ | Ar + $N_2O$ | Ar + $H_2O$ |
| | Processing fluid ratio | | 2:1 | 2:1 | 1.5:1 | 1.5:1 | 1.5:1 | 1.5:1 |
| | Fluid injection diameter (μm) | | 700 | 700 | 700 | 700 | 700 | 700 |
| Body obtained by processing solid carbon-containing material | Maximum height difference of processed surface (μm) | | 9 | 15 | 8 | 12 | 10 | 7 |
| | Recessed part area ratio of processed surface (%) | | 73 | 75 | 75 | 80 | 85 | 75 |

Example 6

As a solid carbon-containing material, a polycrystalline diamond substrate of a 5 mm×5 mm×a thickness of about 0.5 mm prepared on a silicon substrate by a chemical vapor deposition (CVD) method was prepared. The thickness is an average of five points on the substrate (a center point and four end part points: the same definition as that in Example 1). Since the thickness is measured with a palpation type thickness tester, the maximum value is locally exhibited in a polycrystal having fine irregularities. The surface of the material is still grown. The back surface remains in an interface state with the silicon substrate, and the substrate is removed by a hydrofluoric acid treatment. The four sides of the sample were cut at 0.1 mm from the end, and the cross section thereof was observed with an optical microscope allowing length measurement to calculate a maximum height difference. This material was processed in the same manner as in Example 5. However, a processing fluid type, a processing fluid ratio, and a fluid injection diameter were changed as shown in Table 2. The stay time of the plasma irradiation was adjusted so as to be longer in a thick portion and shorter in a thin portion based on not height difference information but palpation type thickness information. When the height difference after the processing was less than or equal to 20 μm, the maximum height difference of the surface of the material was measured with the laser displacement meter of Example 5. Also in polycrystalline diamond, in the surface of the processed body, a dimple-like depression shape was observed as in the case of the single crystal surface. The results are summarized in Table 2.

TABLE 2

| | | Example 6-1 | Example 6-2 | Example 6-3 | Example 6-4 | Example 6-5 | Example 6-6 |
|---|---|---|---|---|---|---|---|
| | Example 6 | | | | | | |
| solid carbon-containing material | Type | Gas phase synthesis diamond | Gas phase synthesis diamond | Gas phase synthesis diamond | Gas phase synthesis diamond | Gas phase synthesis diamond | Gas phase synthesis diamond |
| | Size (mm × mm) | 5 × 5 | 5 × 5 | 5 × 5 | 5 × 5 | 5 × 5 | 5 × 5 |
| | Front surface condition [front surface/back surface] | Growth surface/ substrate surface | Growth surface/ substrate surface | Growth surface/ substrate surface | Growth surface/ substrate surface | Growth surface/ substrate surface | Growth surface/ substrate surface |
| | Average thickness (μm) | 480 | 500 | 530 | 520 | 500 | 490 |
| | Maximum height difference of surface (μm) | 48 | 55 | 58 | 52 | 43 | 50 |
| Processing of solid carbon-containing material | Processing method | Plasma gas phase fluid | Plasma gas phase fluid | Plasma gas phase fluid | Plasma gas phase fluid | Plasma gas phase fluid | Plasma gas phase fluid |
| | Processing fluid type | He + $CO_2$ | He + $O_2$ | Ar + $CO_2$ | Ar + $O_2$ | Ar + $N_2O$ | Ar + $H_2O$ |
| | Processing fluid ratio | 1:1 | 1:1 | 1:1 | 1:1 | 1:1 | 1:1 |
| | Fluid injection diameter (μm) | 900 | 900 | 900 | 900 | 900 | 900 |
| Body obtained by processing solid carbon-containing material | Maximum height difference of processed surface (μm) | 6 | 12 | 7 | 9 | 11 | 7 |
| | Recessed part area ratio of processed surface (%) | 70 | 75 | 78 | 75 | 80 | 75 |

It should be understood that the embodiment and examples disclosed herein are illustrative and non-restrictive in all respects. The scope of the present invention is defined by the claims, rather than the embodiments above, and is intended to include any modifications within the meaning and scope equivalent to the claims.

REFERENCE SIGNS LIST

10: solid carbon-containing material, 10d, 20d: diamond, 10g, 20g: graphite, 20: Body obtained by processing solid carbon-containing material, 20lsp: least square plane, 20ps: processed surface, 100: producing apparatus, 110: material holding part, 120: fluid forming part, 130: fluid ejection part, 131: injection port, 132: injection port holding part, 140: position control part, F: gas phase fluid, S10: step of preparing solid carbon-containing material, S20: step of forming gas phase fluid, S30: step of processing solid carbon-containing material

The invention claimed is:

1. A method for producing a body obtained by processing a solid carbon-containing material, the method comprising:
   preparing the solid carbon-containing material composed of a material having at least a surface containing solid carbon;
   forming a gas phase fluid containing at least one of an active gas or an active plasma which is active against the solid carbon; and
   processing the solid carbon-containing material by injecting the gas phase fluid onto at least a part of the surface of the solid carbon-containing material.

2. The method according to claim 1, wherein, when the gas phase fluid is injected onto at least a part of the surface of the solid carbon-containing material, an injection port for the gas phase fluid and the solid carbon-containing material are relatively moved.

3. The method according to claim 1, wherein an atmospheric pressure at which the gas phase fluid is injected is greater than or equal to 0.2 atm.

4. The method according to claim 1, wherein the gas phase fluid is a thermal fluid having a temperature of higher than or equal to 300° C.

5. The method according to claim 1, wherein the active plasma is excited by at least one of high frequency discharge of greater than or equal to 0.2 MHz and less than or equal to 5 GHz, radio wave arc discharge, or direct current arc discharge before being injected from the injection port.

6. The method according to claim 1, wherein the active plasma contains at least any excited species of at least any ion and radical selected from the group consisting of $O_2$, $CO_2$, CO, $NO_2$, $N_2O$, $H_2O$, and $H_2$.

7. The method according to claim 1, wherein the active gas contains at least any molecule selected from the group consisting of $O_2$, $CO_2$, CO, $NO_2$, $N_2O$, $H_2O$, and $H_2$.

8. The method according to claim 1, wherein an injection port for the gas phase fluid has a diameter of less than 1 cm.

9. The method according to claim 1, wherein the solid carbon-containing material has at least a surface containing at least one of SP3-combined solid carbon or SP2-combined solid carbon.

10. The method according to claim 1, wherein the solid carbon-containing material has at least a surface containing at least one of single crystal diamond or polycrystalline diamond.

11. The method according to claim 1, wherein the solid carbon-containing material has at least a surface having a laminated structure of a layer containing at least one of single crystal diamond or polycrystalline diamond and a layer containing graphite.

12. An apparatus for producing a body obtained by processing a solid carbon-containing material used in the method according to claim 1, the apparatus comprising:
- a material holding part configured to hold the solid carbon-containing material;
- a fluid forming part configured to form a gas phase fluid;
- a fluid injection part including an injection port configured to inject the gas phase fluid; and
- a control part configured to control at least one position of the solid carbon-containing material or the injection port.

13. A body obtained by processing a solid carbon-containing material, the body comprising at least a processed surface composed of a material containing solid carbon, wherein:
- the processed surface includes a recessed part bowing inward, and a protrusion part bowing outward; and
- a total area of the recessed part is greater than or equal to 60% of a total area of the processed surface when the processed surface is viewed from a direction perpendicular to a least-square plane thereof.

14. The body according to claim 13, wherein at least the processed surface contains at least one of single crystal diamond or polycrystalline diamond.

15. The body according to claim 14, wherein at least the processed surface has a laminated structure of a layer containing at least one of single crystal diamond or polycrystalline diamond and a layer containing greater than or equal to 10% of SP2-combined solid carbon in percentage of intensity of a G band with respect to a D band in Raman scattering spectroscopy.

16. The body according to claim 15, wherein the layer containing the SP2-combined solid carbon is present in a stripe pattern on the processed surface.

17. The body according to claim 13, wherein a maximum height difference between the recessed part and the protrusion part in the processed surface is less than or equal to 30 µm.

18. The body according to claim 13, wherein the recessed part in the processed surface has a dimple shape.

19. The body according to claim 18, wherein the dimple shape of the recessed part in the processed surface is a line shape.

* * * * *

UNITED STATES PATENT AND TRADEMARK OFFICE
CERTIFICATE OF CORRECTION

PATENT NO. : 11,518,680 B2
APPLICATION NO. : 16/638925
DATED : December 6, 2022
INVENTOR(S) : Yoshiki Nishibayashi, Natsuo Tatsumi and Kensei Hamaki It is certified that error appears in the above-identified patent and that said Letters Patent is hereby corrected as shown below:

In the Claims

In Claim 5, Column 20, Line 51, "the injection port" should read "an injection port".

Signed and Sealed this
Second Day of May, 2023

Katherine Kelly Vidal
*Director of the United States Patent and Trademark Office*